US009325330B2

(12) United States Patent
Taniguchi

(10) Patent No.: US 9,325,330 B2
(45) Date of Patent: Apr. 26, 2016

(54) SEMICONDUCTOR DEVICE INCLUDING A CLOCK ADJUSTMENT CIRCUIT

(71) Applicant: MICRON TECHNOLOGY, INC., Boise, ID (US)

(72) Inventor: Nobutaka Taniguchi, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 13 days.

(21) Appl. No.: 14/509,894

(22) Filed: Oct. 8, 2014

(65) Prior Publication Data
US 2015/0097604 A1    Apr. 9, 2015

(30) Foreign Application Priority Data
Oct. 8, 2013    (JP) .................. 2013-211373

(51) Int. Cl.
*H03L 7/00*    (2006.01)
*H03L 7/085*    (2006.01)
*H03K 5/14*    (2014.01)

(52) U.S. Cl.
CPC . *H03L 7/085* (2013.01); *H03K 5/14* (2013.01)

(58) Field of Classification Search
USPC .......................... 327/161, 147–149, 156–158
See application file for complete search history.

(56) References Cited

U.S. PATENT DOCUMENTS

| 8,610,460 | B2 * | 12/2013 | Kang .................. G11C 7/1045 326/30 |
| 2011/0241742 | A1 * | 10/2011 | Kim .................... G11C 7/1057 327/158 |
| 2012/0072650 | A1 * | 3/2012 | Suzumura ............... G06F 13/16 711/103 |
| 2013/0028037 | A1 * | 1/2013 | Fujisawa ................ G11C 7/222 365/222 |
| 2013/0031305 | A1 * | 1/2013 | Fujisawa .......... G11C 11/40611 711/106 |
| 2014/0015574 | A1 * | 1/2014 | Lee ....................... H03L 7/0814 327/156 |
| 2014/0126613 | A1 * | 5/2014 | Zhang .................... H03D 3/006 375/219 |
| 2014/0293719 | A1 * | 10/2014 | Jung ........................ G11C 7/02 365/194 |
| 2015/0179248 | A1 * | 6/2015 | Patil ..................... G11C 7/1057 365/233.1 |
| 2015/0214965 | A1 * | 7/2015 | Odedara .................. H03L 7/07 327/158 |
| 2015/0227638 | A1 * | 8/2015 | Crucs ................ G06F 17/30893 715/760 |
| 2015/0256187 | A1 * | 9/2015 | Hwang ................. H03L 7/0802 365/194 |

FOREIGN PATENT DOCUMENTS

JP    2011-009922    1/2011

* cited by examiner

Primary Examiner — Adam Houston
(74) Attorney, Agent, or Firm — Dorsey & Whitney LLP

(57) ABSTRACT

Disclosed herein is a semiconductor device that includes a first circuit comprising a plurality of first logic elements coupled in cascade and configured, in response to first and second clock signals and a control signal, to produce control information that indicates a first number of the first logic elements through which the control signal has been propagated during a period defined by a first change in logic level of the first clock signal and by a second change in logic level of the second clock signal, the first and second changes occurring adjacently to each other in same directions as each other, and a second circuit comprising a delay circuit configured to receive the first clock signal and the control information and to produce a third clock signal by delaying the first clock signal by an amount responsive to the control information.

18 Claims, 19 Drawing Sheets

(a)

(b)

SEMICONDUCTOR DEVICE INCLUDING A CLOCK ADJUSTMENT CIRCUIT

RELATED REFERENCE

This application is based upon and claims the benefit of priority from Japanese Patent Application No. 2013-211373 filed on Oct. 8, 2013, the disclosure of which is incorporated herein in its entirety by reference.

BACKGROUND

1. Field of the Invention

The present invention relates to a semiconductor device and, more specifically, to a semiconductor device including a variable delay circuit to generate an internal clock signal.

2. Description of Related Art

A semiconductor device such as a DRAM (Dynamic Random Access Memory) may include a clock generating circuit that generates an internal clock signal controlled in phase. As a typical clock generating circuit, a DLL (Delay Locked Loop) circuit is known as a clock adjustment circuit. The DLL circuit has a variable delay circuit that delays an external clock signal to generate an internal clock signal.

In the DLL circuit, a time taken for an initial operation may be problematic. This is because, in the initial operation, since the phase of an internal clock signal largely changes, a relatively long time is taken until the internal clock signal is locked. The term "locked" means a state in which the internal clock signal is correctly controlled in phase. As a method for solving the problem, a method of directly measuring a phase difference with an oscillator is proposed (Japanese Patent Application Laid Open No. 211-9922).

SUMMARY

In one embodiment of the disclosure, there is provided a semiconductor device that includes: a phase difference detection circuit configured, in response to first and second clock signals each clocking between first and second logic levels, to generate a first control signal that takes an active level defined by a first change of the first clock signal from the first logic level to the second logic level and by a second change of the second clock signal from the first logic level to the second logic level; a register circuit including a plurality of logic elements coupled in series and receiving the first control signal and a second control signal, the register circuit being configured to pass the second control signal through the logic elements during the active level of the first control signal to generate control information that indicates a number of the logic elements through which the second control signal has passed during the active level of the first control signal; and a delay circuit receiving the first clock signal and the control information, configured to produce a third clock signal by delaying the first clock signal by an amount responsive to the control information.

In another embodiment of the disclosure, there is provided a semiconductor device that includes: a delay circuit receiving a first clock signal and being configured to produce a second clock signal by delaying the first clock signal by an amount based on control information; a feedback circuit configured to produce a third clock signal in response to the second clock signal; a phase difference detection circuit configured, in response to the first and third clock signals, to generate a control pulse of which a pulse width corresponds to a duration defined by a first change in logic level of the third clock signal and by a second change in logic level of the first clock signal, the first and second changes occurring adjacently to each other in same directions as each other; and a plurality of first logic elements through which a control signal is allowed to pass one after another during the pulse width of the control pulse so that the control information, that is supplied to the delay circuit, is generated in response to a first number of the first logic elements through which the control signal has passed during the pulse width of the control pulse.

According to still another embodiment of the disclosure, there is provided a semiconductor device that includes: a first circuit comprising a plurality of first logic elements coupled in cascade and configured, in response to first and second clock signals and a control signal, to produce control information that indicates a first number of the first logic elements through which the control signal has been propagated during a period defined by a first change in logic level of the first clock signal and by a second change in logic level of the second clock signal, the first and second changes occurring adjacently to each other in same directions as each other; and a second circuit comprising a delay circuit configured to receive the first clock signal and the control information and to produce a third clock signal by delaying the first clock signal by an amount responsive to the control information.

BRIEF DESCRIPTION OF THE DRAWINGS

The above features and advantages of the present invention will be more apparent from the following description of certain embodiments taken in conjunction with the accompanying drawings, in which.

DETAILED DESCRIPTION

The invention will be now described herein with reference to illustrative embodiments. Those skilled in the art will recognize that many alternative embodiments can be realized using the teachings of the present invention and that the invention is not limited to the embodiments illustrated for explanatory purposes.

A first embodiment of the present invention will be described below in detail with reference to the accompanying drawings.

Figure 1:
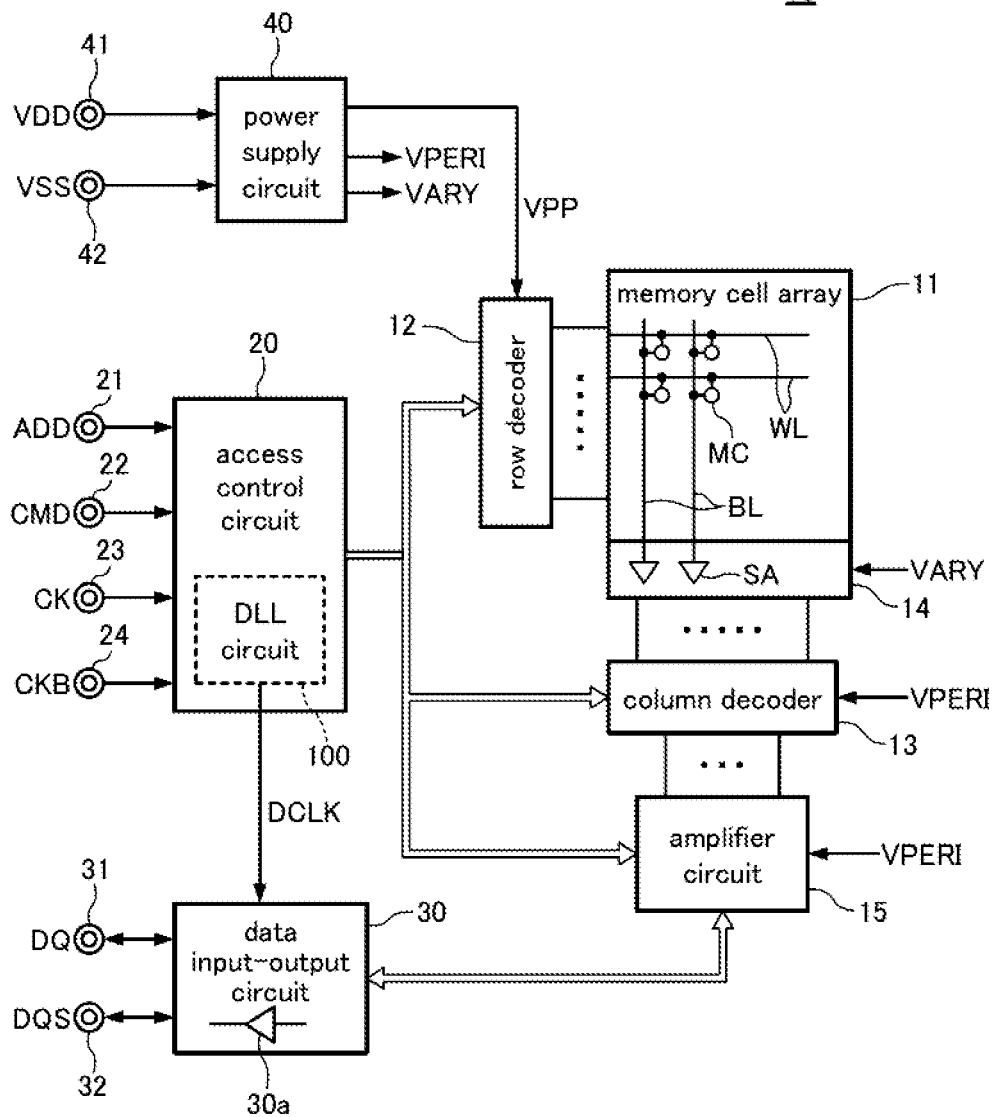
FIG. 1 is a block diagram showing an entire configuration of a semiconductor device according to an embodiment of the present invention.

FIG. 1 is a block diagram showing an entire configuration of a semiconductor device 10 according to an embodiment of the present invention.

The semiconductor device 10 according to the embodiment is a DRAM, and includes a memory cell array 11 as shown in FIG. 1. In the memory cell array 11, a plurality of word lines WL and a plurality of bit lines BL are arranged, the word lines WL and the bit lines BL crossing each other, and memory cells MC are arranged at nodes between the word lines WL and the bit lines BL, respectively. Selection of the word lines WL is performed by a row decoder 12, and selection of the bit lines BL is performed by a column decoder 13. The bit lines BL are connected to corresponding sense amplifiers SA in a sense circuit 14, respectively. The bit line BL selected by the column decoder 13 is connected to an amplifier circuit 15 through the sense amplifier SA.

The operations of the row decoder 12, the column decoder 13, the sense circuit 14, and the amplifier circuit 15 are controlled by an access control circuit 20. An address signal ADD, a command signal CMD, external clock signals CK and CKB, and the like are supplied to the access control circuit 20 through external terminals 21 to 24. The external clock signals CK and CKB are signals that are complementary to each other. The access control circuit 20 controls, on the basis of the signals, the row decoder 12, the column decoder 13, the sense circuit 14, an amplifier circuit 15, and a data input-output circuit 30.

More specifically, when the command signal CMD indicates an active command, the address signal ADD is supplied to the row decoder 12. In response to this, the row decoder 12 selects a word line WL indicated by the address signal ADD. In this manner, corresponding memory cells MC are connected to the bit lines BL, respectively. Thereafter, the access control circuit 20 activates the sense circuit 14 at a predetermined timing.

On the other hand, when the command signal CMD indicates a read command or a write command, the address signal ADD is supplied to the column decoder 13. In response to this, the column decoder 13 connects the bit line BL indicated by the address signal ADD to the amplifier circuit 15. For this reason, in a read operation, read data DQ read from the memory cell array 11 is output from a data terminal 31 to the outside through the amplifier circuit 15 and a data input-output circuit 30. In a write operation, a write data DQ supplied from the outside through the data terminal 31 and the data input-output circuit 30 is written in the memory cells MC through the amplifier circuit 15 and the sense amplifier SA.

As shown in FIG. 1, the access control circuit 20 includes a DLL circuit 100. The DLL circuit 100 is a circuit that receives the external clock signals CK and CKB and generates a clock signal DCLK controlled in phase on the basis of the external clock signals CK and CKB. Details of the DLL circuit 100 will be described later. The clock signal DCLK is supplied to an output circuit 30*a* included in the data input-output circuit 30. In this manner, the read data DQ and a data strobe signal DQS are output from the data terminal 31 and a data strobe terminal 32 in synchronization with the clock signal DCLK.

Each of the circuit blocks uses a predetermined internal voltage as an operating power supply. The internal power supplies are generated by a power supply circuit 40 shown in FIG.

1. The power supply circuit 40 receives an external potential VDD and a ground potential VSS supplied through power supply terminals 41 and 42, respectively, and generates internal voltages VPP, VPERI, VARY, and the like on the basis of the external potential VDD and the ground potential VSS. The internal voltage VPP is generated by boosting the external potential VDD, and the internal voltages VPERI and VARY are generated by stepping down the external potential VDD.

The internal voltage VPP is a voltage mainly used in the row decoder 12. The row decoder 12 drives the word line WL selected on the basis of the address signal ADD to a VPP level so as to energize cell transistors included in the memory cell MC. The internal voltage VARY is a voltage mainly used in the sense circuit 14. When the sense circuit 14 is activated, one of a pair of bit lines is driven to a VARY level and the other is driven to a VSS level to amplify read data that is read out. The internal voltage VPERI is used as an operating voltage of most of peripheral circuits such as the access control circuit 20. When the internal voltage VPERI lower than the external voltage VDD is used as the operating voltage for the peripheral circuits, a lower power consumption of the semiconductor device 10 is achieved.

Figure 2:
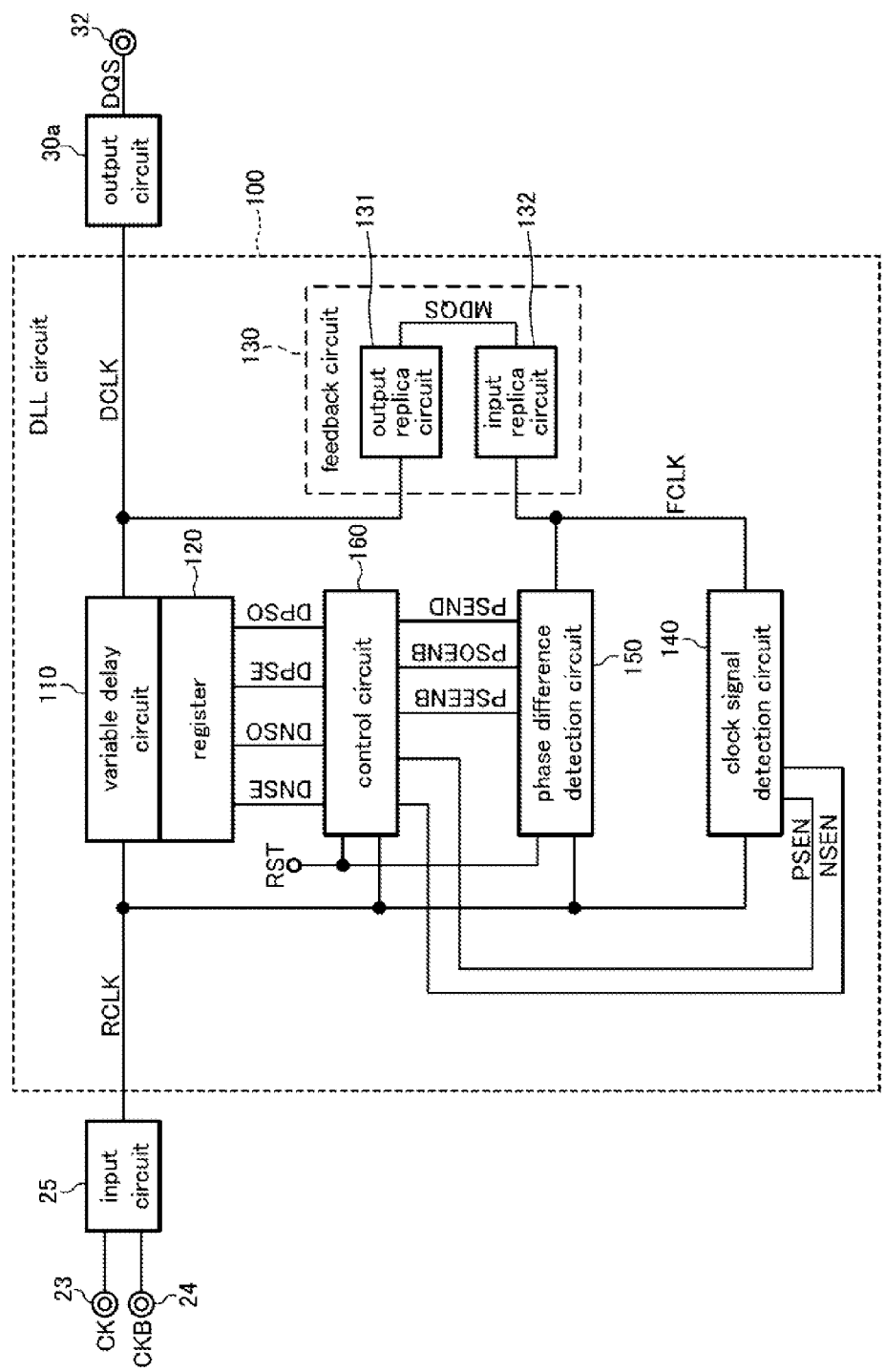
FIG. 2 is a block diagram showing a configuration of a delay locked loop (DLL) circuit according to an embodiment of the invention.

FIG. 2 is a block diagram showing a configuration of the DLL circuit 100 according to an embodiment of the invention.

As shown in FIG. 2, the DLL circuit 100 is a circuit that generates the clock signal DCLK in response to a clock signal RCLK. The clock signal RCLK is generated by an input circuit 25 that receives the external clock signals CK and CKB. The input circuit 25 changes the phases of the complementary external clock signals CK and CKB into single phases to generate the clock signal RCLK. Thus, the clock signal RCLK has almost the same waveform as that of each of the external clock signals CK and CKB. For this reason, in this specification, the clock signal RCLK may be identified as each of the external clock signals CK and CKB.

The clock signal RCLK input to the DLL circuit 100 is delayed by the variable delay circuit 110. A delay amount of the variable delay circuit 110 is controlled by a set value of a register 120. The clock signal RCLK delayed by the variable delay circuit 110 is output as the clock signal DCLK. As described above, the clock signal DCLK is supplied to the output circuit 30*a* to regulate output timings of the data strobe signal DQS or the like.

As shown in FIG. 2, the clock signal DCLK is supplied to a feedback circuit 130 in the DLL circuit 100. The feedback circuit 130 has a configuration in which an output replica circuit 131 and an input replica circuit 132 are connected in series with each other. The output replica circuit 131 is a replica circuit of the output circuit 30*a*. Thus, the output replica circuit 131 has a delay amount substantially equal to that of the output circuit 30a. Similarly, the input replica circuit 132 is a replica circuit of the input circuit 25. For this reason, the input replica circuit 132 has a delay amount substantially equal to that of the input circuit 25.

With this configuration, a clock signal MDQS output from the output replica circuit 131 is accurately synchronized with the data strobe signal DQS output from the data strobe terminal 32. The data strobe signal DQS is accurately synchronized with the external clock signals CK and CKB with an operation of the DLL circuit 100. In this case, a clock signal FCLK output from the input replica circuit 132 is accurately synchronized with the clock signal RCLK output from the input circuit 25. The clock signal FCLK is supplied to a clock signal detection circuit 140 and a phase difference detection circuit 150.

The clock signal detection circuit 140 is a circuit that compares the phase of the clock signal RCLK and the phase of the clock signal FCLK with each other. As a result of the comparison, depending on which clock signal has an advanced phase, any one of control signals PSEN and NSEN is activated. The control signals PSEN and NSEN are supplied to a control circuit 160. The clock signal detection circuit 140 may also be called a phase comparator or a phase director.

The phase difference detection circuit 150 is a circuit that detects a phase difference between the clock signal RCLK and the clock signal FCLK. A result of the detection is supplied to the control circuit 160 as control signals PSEENB, PSOENB, and PSEND.

The phase difference detection circuit 150, the control circuit 160, and the register 120 constitute one control circuit.

Figure 3:
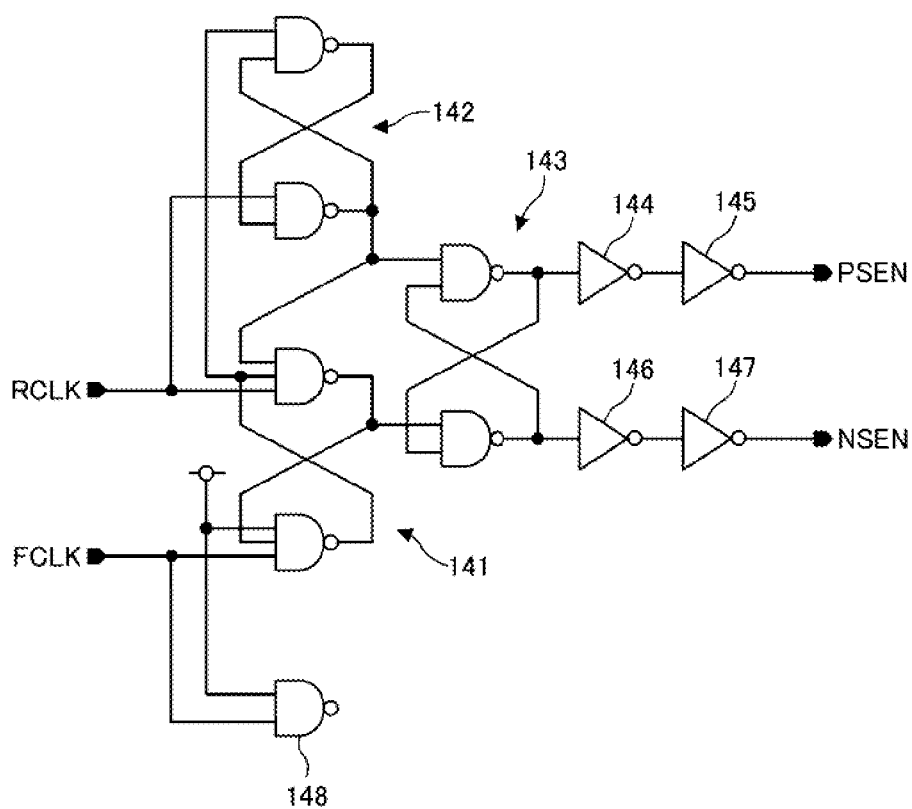
FIG. 3 is a circuit diagram of a clock signal detection circuit according to an embodiment of the invention.

FIG. 3 is a circuit diagram of the clock signal detection circuit 140 according to an embodiment of the invention.

As shown in FIG. 3, the clock signal detection circuit 140 includes three SR (set/reset) latch circuits 141 to 143. The SR latch circuit 141 is set when the clock signal RCLK goes to a low level. The SR latch circuit 141 is reset when the clock signal FCLK is at a low level at a rising edge of the clock signal RCLK. An output signal from the SR latch circuit 142 is also supplied to the SR latch circuit 141. In this manner, in a period in which the SR latch circuit 142 is reset, the SR latch circuit 141 is kept in a set state.

The SR latch circuit 142 is also set when the clock signal RCLK goes to a low level. The SR latch circuit 142 is reset when the clock signal FCLK is at a low level at a rising edge of the clock signal RCLK in a state in which the SR latch circuit 141 is set.

The SR latch circuit 143 is set when the SR latch circuit 142 is reset, and reset when the SR latch circuit 141 is reset. A set output from the SR latch circuit 143 is output as the control signal PSEN through inverters 144 and 145. A reset output from the SR latch circuit 143 is output as a control signal NSEN through inverters 146 and 147.

A NAND circuit (logic element) 148 is a dummy circuit to make input loads of the clock signal RCLK and the clock signal FCLK equal to each other.

Figure 4:
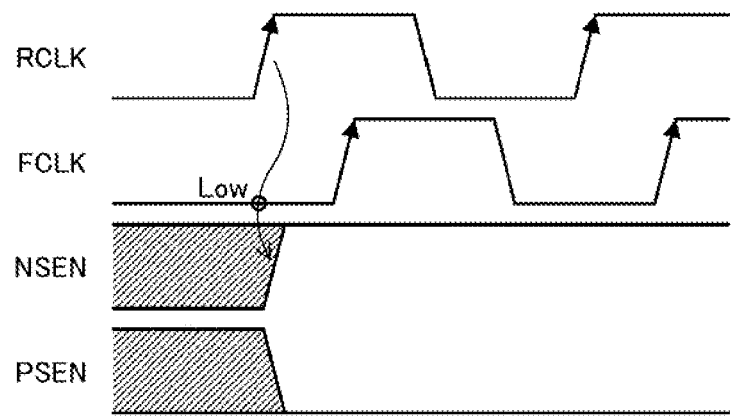
FIG. 4 is a waveform chart for explaining an operation of the clock signal detection circuit of FIG. 3.
Figure 4:
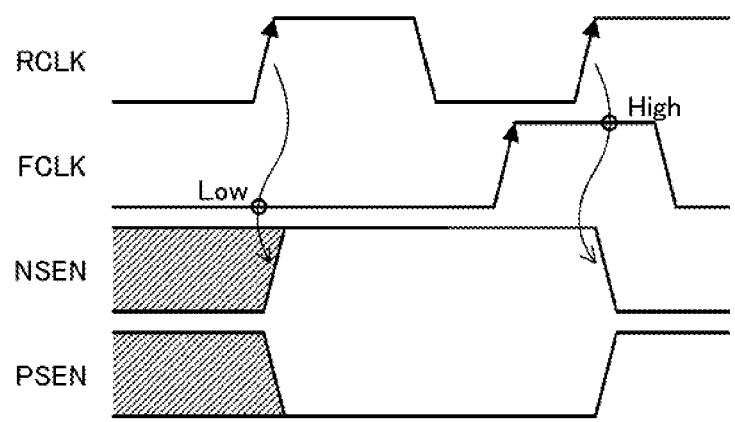

FIG. 4 is a waveform chart for explaining an operation of the clock signal detection circuit 140 according to an embodiment of the invention.

As shown in FIGS. 4A and 4B, when the clock signal FCLK is at a low level at a rising edge of the clock signal RCLK, the control signals PSEN and NSEN go to a low level and a high level, respectively. As in a case shown in FIG. 4A, when this state continues, the control signals PSEN and NSEN are kept at the low level and the high level, respectively. This means that the control signals PSEN and NSEN go to the low level and the high level, respectively, when the phase of the clock signal FCLK is delayed with reference to the phase of the clock signal RCLK.

On the other hand, in a case shown in FIG. 4B, the clock signal FCLK is at a high level at a rising edge of the next clock signal RCLK. In this case, the control signals PSEN and NSEN go to a high level and a low level, respectively. This means that the control signals PSEN and NSEN go to a high level and a low level, respectively, when the phase of the clock signal FCLK advances with reference to the phase of the clock signal RCLK.

Figure 5:
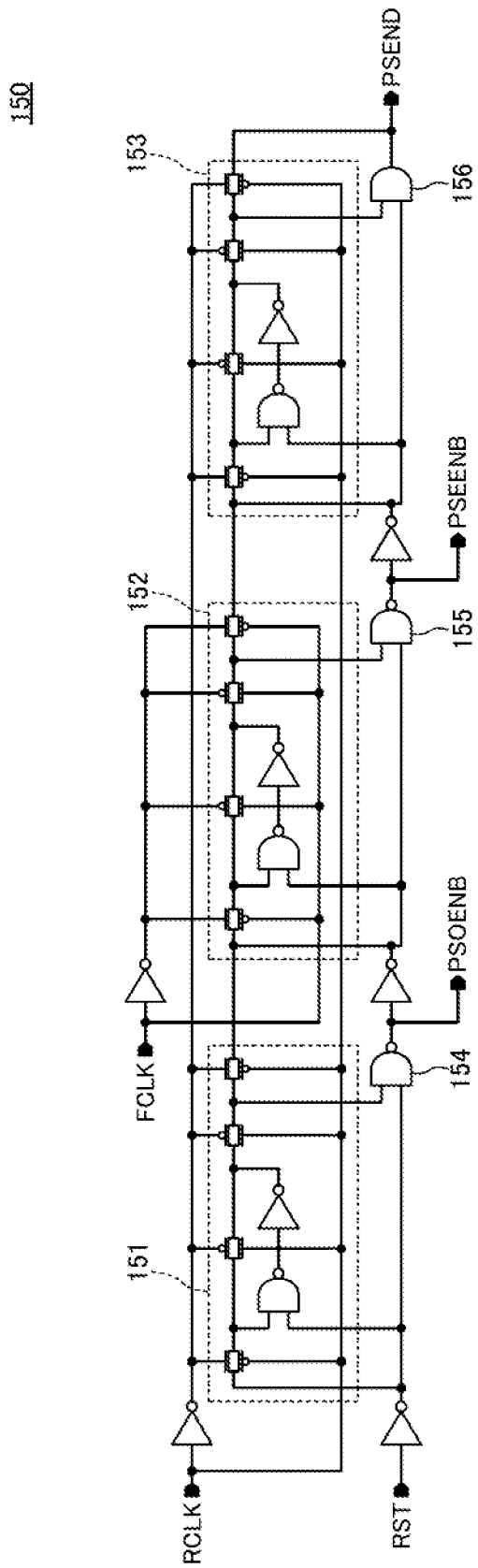
FIG. 5 is a circuit diagram of a phase difference detection circuit according to an embodiment of the invention according to an embodiment of the invention.

FIG. 5 is a circuit diagram of the phase difference detection circuit 150 according to an embodiment of the invention.

As shown in FIG. 5, the phase difference detection circuit 150 includes three latch circuits 151 to 153 connected in series with each other. Of the three latch circuits, the latch circuits 151 and 153 perform latch operations in synchronization with the rising edge of the clock signal RCLK. The latch circuit 152 performs a latch operation in synchronization with the rising edge of the clock signal FCLK. An inverted signal of a reset signal RST is input to the latch circuit 151 of an initial stage. The reset signal RST is a signal that is activated when the DLL circuit 100 is initialized and periodically activated at predetermined timings.

An output signal from the latch circuit 151 and the inverted signal of the reset signal RST are input to a NAND circuit 154. An output signal from the NAND circuit 154 is used as the control signal PSOENB. Furthermore, the output signal from the latch circuit 152 and the inverted signal of the control signal PSOENB are input to a NAND circuit 155. An output signal from the NAND circuit 155 is used as the control signal PSEENB. The output signal from the latch circuit 153 and an inverted signal of the control signal PSEENB are input to an AND circuit 156. An output signal from the AND circuit 156 is used as the control signal PSEND.

Figure 6:
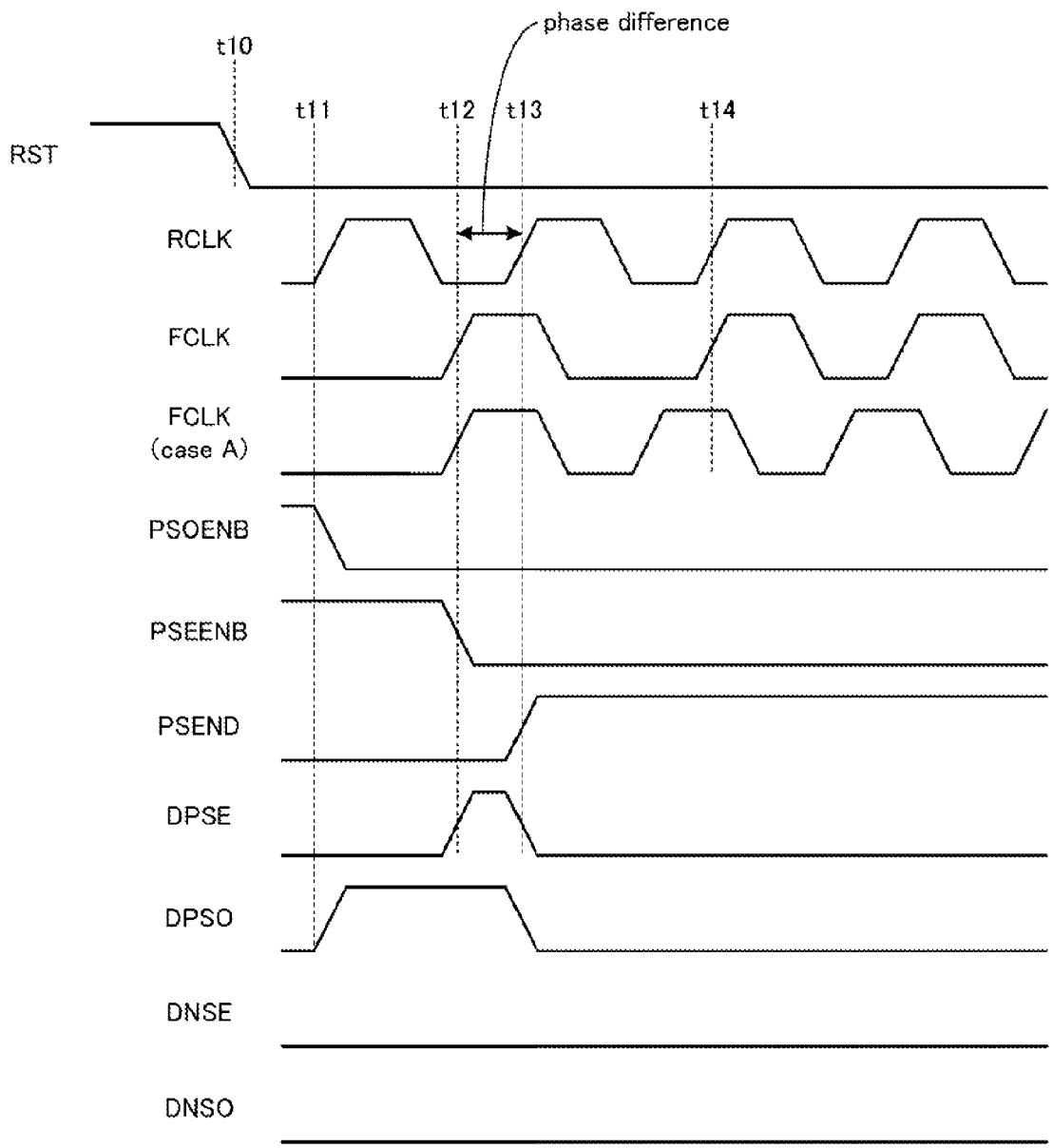
FIG. 6 is a waveform chart for explaining an operation of the phase difference detection circuit of FIG. 5 according to an embodiment of the invention.

FIG. 6 is a waveform chart for explaining an operation of the phase difference detection circuit 150 according to an embodiment of the invention.

In an example shown in FIG. 6, the reset signal RST changes from a high level to a low level at time t10. At this time, the reset signal RST is activated. For a period in which the reset signal RST is at the high level, the control signals PSOENB and PSEENB are fixed to a high level, and the control signal PSEND is fixed to a low level.

When the reset signal RST changes from a high level to a low level at time t10, latch data of the latch circuits 151 to 153 are sequentially inverted. More specifically, when the clock signal RCLK rises at time t11, the latch circuit 151 is inverted, and the control signal PSOENB changes to a low level. When the clock signal FCLK rises at time t12, the latch circuit 152 is inverted, and the control signal PSEENB changes to a low level. When the clock signal RCLK rises again at time t13, the latch circuit 153 is inverted, the control signal PSEND changes to a high level.

Thereafter, the control signals PSOENB and PSEENB are fixed to a high level, and the control signal PSEND is fixed to a low level. A time taken until the control signal PSEND changes to a high level after the control signal PSEENB goes to a low level corresponds to a phase difference between the clock signal RCLK and the clock signal FCLK.

The control signals PSEN, NSEN, PSEENB, PSOENB, and PSEND generated as described above are supplied to the control circuit 160 shown in FIG. 2. Although details will be described later, control of the register 120 by the control circuit 160 is divided into an initial operation and a tracking operation.

The initial operation is an operation that jumps the phase of the clock signal DCLK at once on the basis of a control signal supplied from the phase difference detection circuit 150 when the reset signal changes to a low level. Although the details of the initial operation will be described later with reference to FIG. 14 and FIG. 15, waveforms of various control signals in the initial operation are as shown in FIG. 6. For example, the control signal DPSE goes to a high level for the period from time t12 to time t13. The control signal DPSO goes to a high level for a period from time t11 to time t13. The control signals DNSE and DNSO are kept at a low level.

In the example shown in FIG. 6, the initial operation is completed at time t14. At the point of time, the phases of the clock signals RCLK and FCLK are the same as each other. In contrast to this, when the initial operation is not performed (case A), as shown in FIG. 6, the phases of the clock signals RCLK and FCLK are not immediately the same as each other.

The tracking operation is executed after the initial operation is performed. The tracking operation is an operation that causes the clock signal FCLK to track the clock signal RCLK on the basis of a control signal supplied from the clock signal detection circuit 140. Details of the tracking operation will be described later with reference to FIG. 16 and FIG. 17.

In addition, a fine adjustment operation is carried out after the initial operation or the tracking operation. A phase adjustment of the initial operation or the tracking operation has an error of delay time of about two NAND. This error is canceled by the fine adjustment operation which is well-known technology. The fine adjustment operation is an operation that causes the clock signal FCLK to track the clock signal RCLK on the basis of a control signal supplied from the clock signal detection circuit 140.

A phase difference detection circuit 150 is configured, in response to clock signals RCLK, FCLK each clocking between first and second logic levels, to generate a control signal DPSE that takes an active level defined by a first change of the clock signal RCLK from the first logic level to the second logic level and by a second change of the clock signal FCLK from the first logic level to the second logic level. The first and second changes occur adjacently to each other in same directions as each other.

A register 120 includes a plurality of NAND circuits (logic elements) coupled in series. The register 120 receives the control signal DPSE and a control signal DPSO. The register 120 is configured to pass the control signal DPSO through the NAND circuits during the active level of the control signal DPSE to generate control information that indicates a number N1 of the NAND circuits through which the control signal DPSO has passed during the active level of the control signal DPSE.

A variable delay circuit 110 is configured to receive the clock signal RCLK and the control information, to produce a clock signal DCLK by delaying the clock signal RCLK by an amount responsive to the control information. The variable delay circuit 110 comprises a plurality of NAND circuits coupled in series. The clock signal RCLK passes through the NAND circuits. A number N2 of the NAND circuits through which the clock signal RCLK has passed is equal to a total number of a predetermine number (two) and the number N1.

On the other hand, the phase difference detection circuit 150 is configured to generate a control pulse of which a pulse width corresponds to a duration defined by the second change in logic level of the clock signal FCLK and by the first change in logic level of the clock signal RCLK.

A control signal DPSO is allowed to pass one after another through the NAND circuits in the register 120 during the pulse width of the control pulse so that the control information, that is supplied to the variable delay circuit 110, is generated in response to the number N1 of the NAND circuits through which the control signal DPSO has passed during the pulse width of the control pulse.

Figure 7:
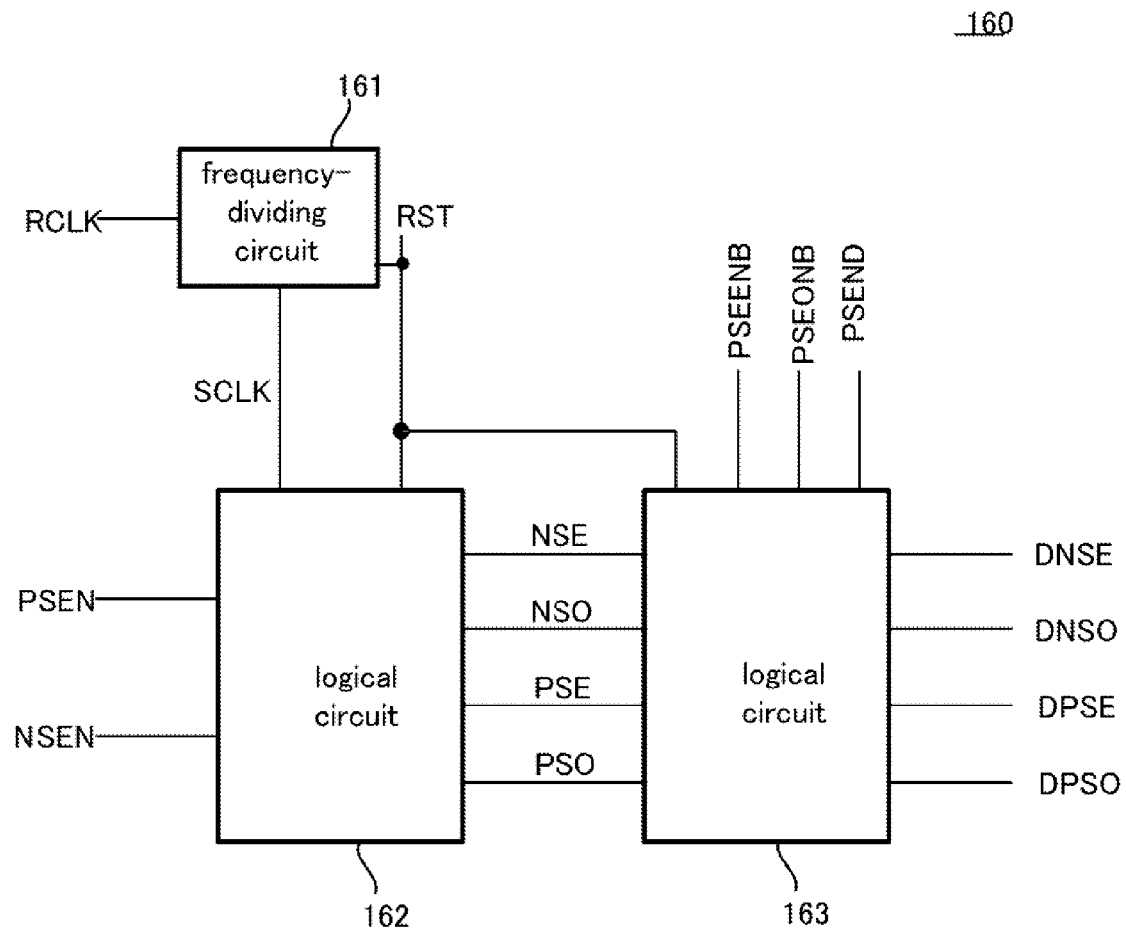
FIG. 7 is a block diagram showing a configuration of a control circuit according to an embodiment of the invention.

FIG. 7 is a block diagram showing a configuration of the control circuit 160 according to an embodiment of the invention.

As shown in FIG. 7, the control circuit 160 includes a frequency-dividing circuit 161 and logical circuits 162 and 163. The frequency-dividing circuit 161 divides the frequency of the clock signal RCLK to generate a clock signal SCLK having a lower frequency. A division frequency ratio is 2, for example.

The control signals PSEN and NSEN, the clock signal SCLK, and the reset signal RST are supplied to he logical circuit 162. The logical circuit 162, on the basis of the signals, generates control signals NSE, NSO, PSE, and PSO.

The control signals NSE, NSO, PSE, PSO, PSEENB, PSOENB, and PSEND and the reset signal RST are supplied to the logical circuit 163. The logical circuit 163, on the basis of the signals, generates the control signals DNSE, DNSO, DPSE, and DPSO.

When the reset signal RST changes to a low level, the clock signal SCLK is fixed to a low level for a definite period. Therefore, control signals PSO, PSE, NSE, and NSO are fixed to the low level. At this time, the initial operation of FIG. 6 is carried out.

Figure 8:
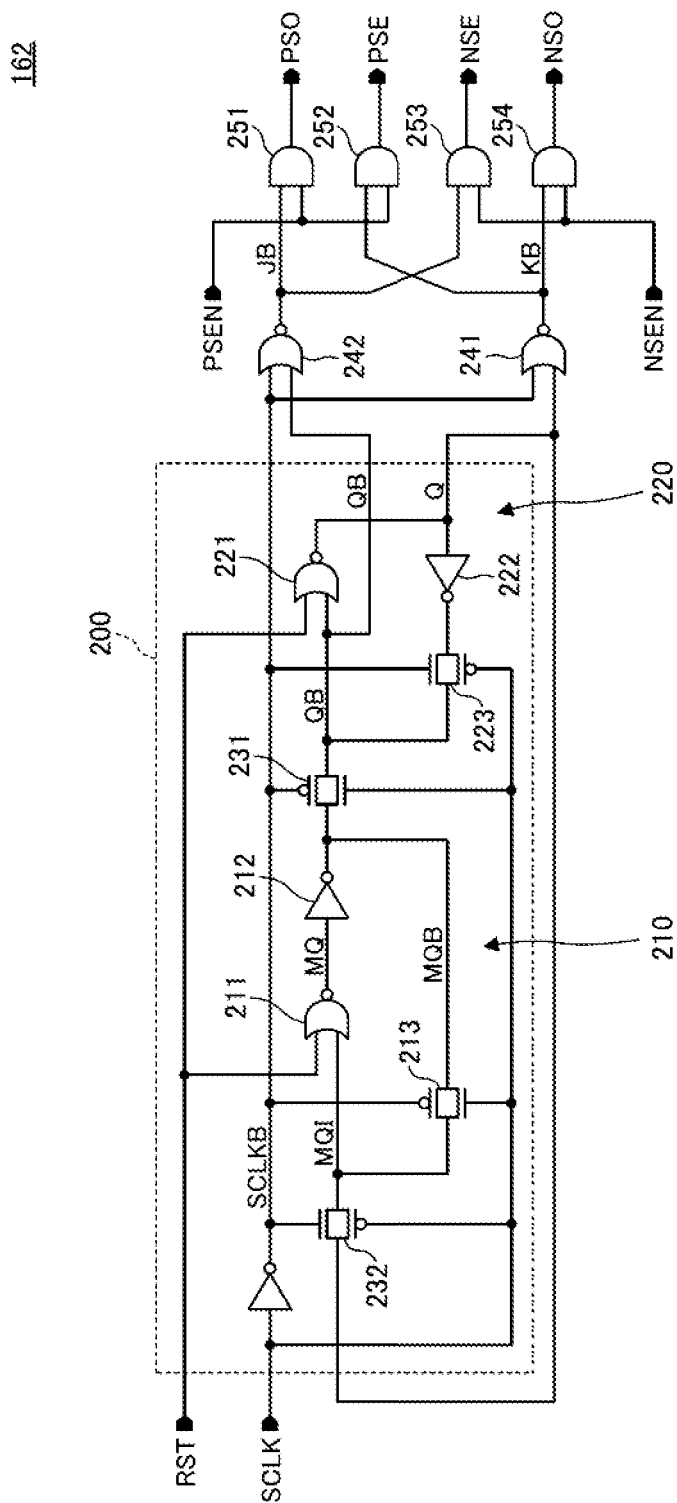
FIG. 8 is a circuit diagram of a logical circuit according to an embodiment of the invention.
Figure 9:
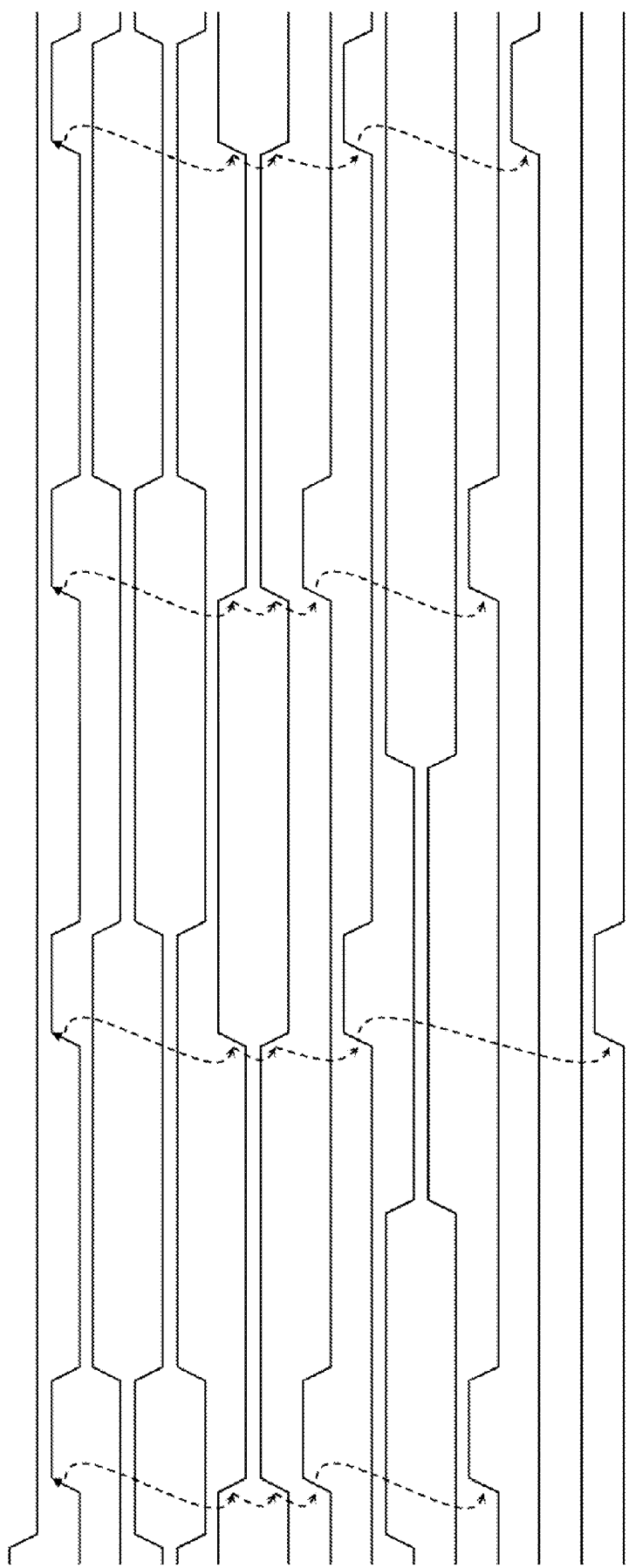
FIG. 9 is a waveform chart showing an operation of the logical circuit according to an embodiment of the invention.

FIG. 8 is a circuit diagram of the logical circuit 162 according to an embodiment of the invention. FIG. 9 is a waveform chart showing an operation of the logical circuit 162 according to an embodiment of the invention.

As shown in FIG. 8, the logical circuit 162 includes a flip-flop circuit 200 that performs toggle operation in synchronization with the clock signal SCLK. The flip-flop circuit 200 is activated when the reset signal RST goes to a low level to start generation of an output signal Q and an inverted output signal QB. More specifically, the flip-flop circuit 200 has a configuration in which latch circuits 210 and 220 are circularly connected to each other. A transfer gate 231 is connected between the output node of the latch circuit 210 and the input node of the latch circuit 220. A transfer gate 232 is connected between the output node of the latch circuit 220 and the input node of the latch circuit 210.

The latch circuit 210 has a configuration in which a NOR circuit 211, an inverter circuit 212, and a transfer gate 213 are circularly connected to each other. An input signal MQI is supplied to one input node of the NOR circuit 211, and the reset signal RST is supplied to the other input node. The input signal MQI is the output signal Q passing through the transfer gate 232.

The latch circuit 220 has a configuration in which a NOR circuit 221, an inverter circuit 222, and a transfer gate 223 are circularly connected to each other. An inverted output signal QB is supplied to one input node of the NOR circuit 221, and the reset signal RST is supplied to the other input node. The inverted output signal QB is an output signal MQB of the latch circuit 210 passing through the transfer gate 231.

The transfer gates 213 and 231 are energized when the clock signal SCLK is at a high level. On the other hand, the transfer gates 223 and 232 are energized when the clock signal SCLK is set at a low level.

With this configuration, the output signal Q and the inverted output signal QB are inverted in synchronization with the rising edge of the clock signal SCLK as shown in FIG. 9.

As shown in FIG. 8, the logical circuit 162 further includes NOR circuits 241 and 242 and AND circuits 251 to 254. The output signal Q and the inverted output signal QB are supplied to one input nodes of the NOR circuits 241 and 242, respectively. The inverted clock signal SCLKB is supplied to the other input nodes of the NOR circuits 241 and 242. With this configuration, output signals KB and JB from the NOR circuits 241 and 242 alternately go to a high level each time the clock signal SCLK goes to a high level as shown in FIG. 9 during the tracking operation.

The output signal JB is supplied to one input nodes of the AND circuits 251 and 253. The output signal KB is supplied to one input nodes of the AND circuits 252 and 254. The control signal PSEN is supplied to the other input nodes of the AND circuits 251 and 252. The control signal NSEN is supplied to the other input nodes of the AND circuits 253 and 254.

With this configuration, when the control signal PSEN is activated to a high level, the control signals PSE and PSO are alternately activated in synchronization with the clock signal SCLK. The control signal PSEN is activated when the phase of the clock signal FCLK advances. On the other hand, when the control signals NSEN is activated to a high level, the control signals NSE and NSO are alternately activated in synchronization with the clock signal SCLK. The control signal NSEN is activated when the phase of the clock signal FCLK is delayed.

Figure 10:
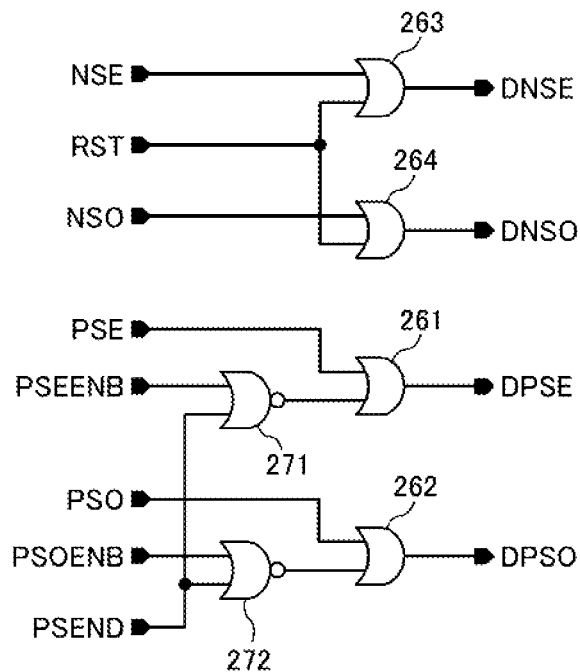
FIG. 10 is a circuit diagram of a logical circuit according to an embodiment of the invention.
Figure 11:
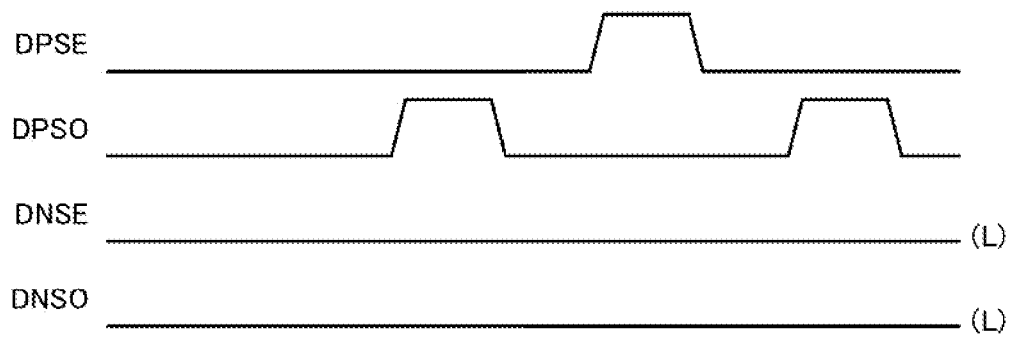
FIG. 11 is a waveform chart showing an operation of the logical circuit of FIG. 10 according to an embodiment of the invention.
Figure 12:
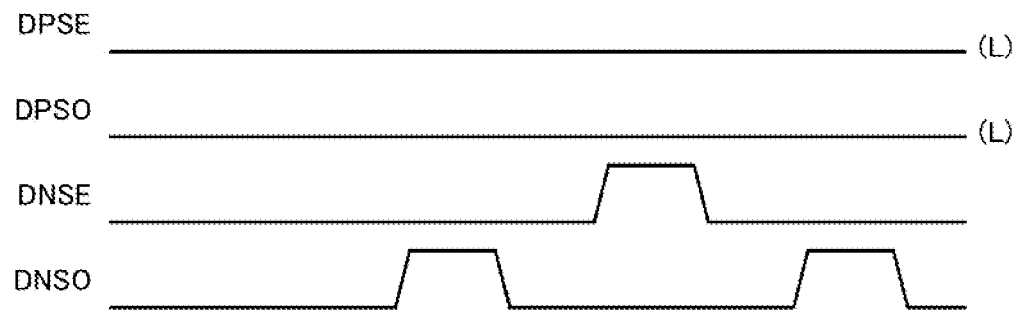
FIG. 12 is a waveform chart showing an operation of the logical circuit of FIG. 10 according to an embodiment of the invention.

FIG. 10 is a circuit diagram of the logical circuit 163 according to an embodiment of the invention. FIGS. 11 and 12 are waveform charts showing an operation of the logical circuit 163 during the tracking operation according to an embodiment of the invention.

As shown in FIG. 10, the logical circuit 163 includes OR circuits 261 to 264 and NOR circuits 271 and 272. The control signals PSE, PSO, NSE, and NSO are supplied to one input nodes of the OR circuits 261 to 264, respectively. The reset signal RST is supplied to the other input nodes of the OR circuits 263 and 264. An output signal from the NOR circuit 271 is supplied to the other input node of the OR circuit 261. The control signals PSEENB and PSEND are supplied to the NOR circuit 271. Furthermore, an output signal from the NOR circuit 272 is supplied to the other input node of the OR circuit 262. The control signals PSOENB and PSEND are supplied to the NOR circuit 272.

With this configuration, when the control signal PSEND is at a high level, the control signals DPSE and DPSO have the same waveforms as those of the control signals PSE and PSO during the tracking operation. FIG. 11 shows a state in which the control signals PSE and PSO are alternately activated so as to alternately activate the control signals DPSE and DPSO. In this case, the control signals DNSE and DNSO are kept at a low level. On the other hand, when the reset signal RST is set at a low level, the control signals DNSE and DNSO have the same waveforms as those of the control signals NSE and NSO. FIG. 12 shows a state in which the control signals NSE and NSO are alternately activated so as to alternately activate the control signals DNSE and DNSO.

When both the control signals PSEENB and PSEND are at a low level, the control signal DPSE forcibly goes to a high level during the initial operation. When both the control signals PSOENB and PSEND are at a low level, the control signal DPSO forcibly goes to a high level during the initial operation. Both the control signals PSEENB and PSEND are set at a low level for a period from time t12 to time t13 shown in FIG. 6. Both the control signals PSOENB and PSEND are set at a low level for a period from time t11 to time t13 shown in FIG. 6. More specifically, each of the states appears immediately after the reset signal RST changes into a low level, and, thereafter, the states do not appear. This is caused by the function of the phase difference detection circuit 150.

The control signals DNSE, DNSO, DPSE, and DPSO generated by the control circuit 160 as described above are supplied to the register 120 shown in FIG. 2.

Figure 13:
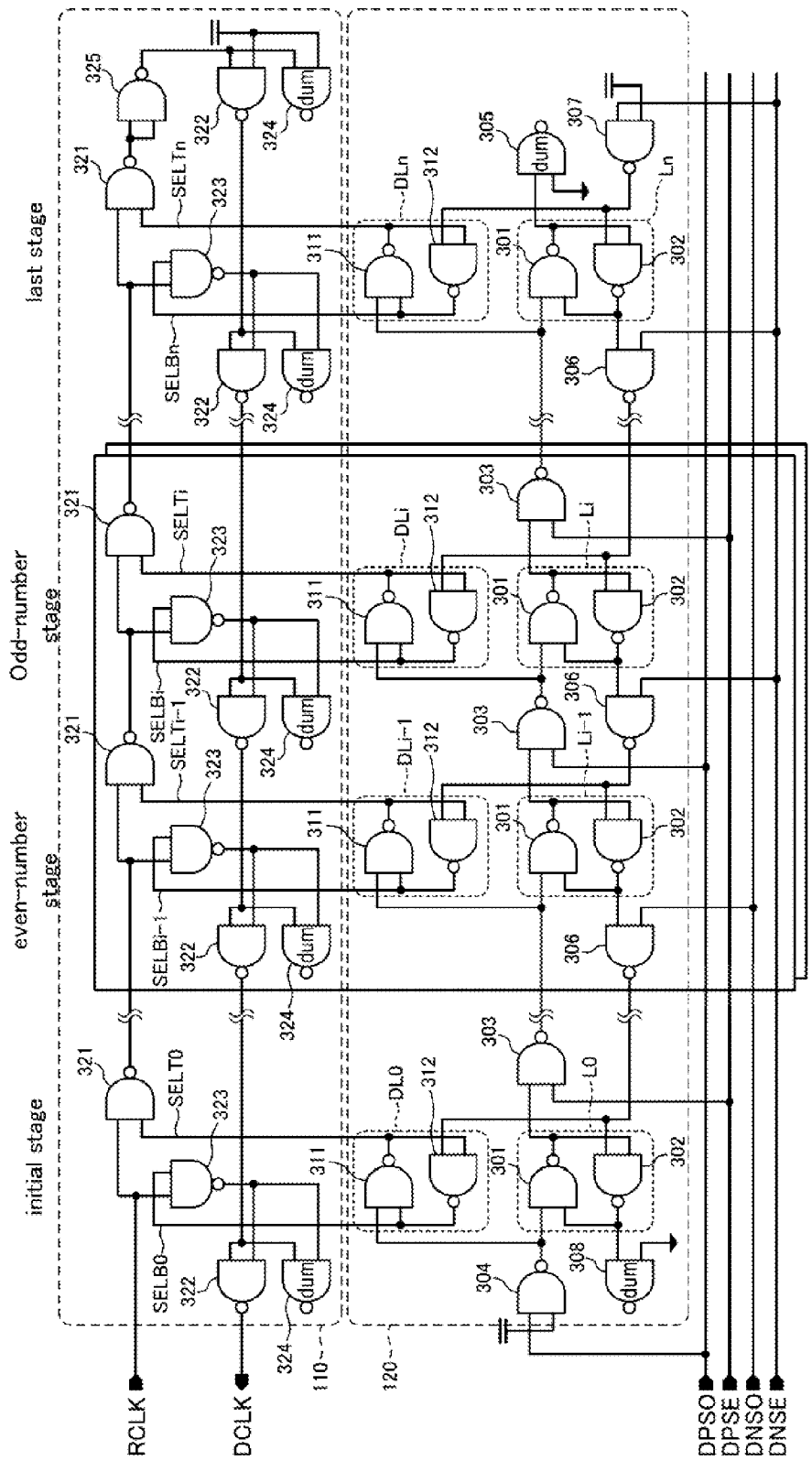
FIG. 13 is a circuit diagram of a variable delay circuit and a register according to an embodiment of the invention.

FIG. 13 is a circuit diagram of the variable delay circuit 110 and the register 120 according to an embodiment of the invention.

As shown in FIG. 13, the register 120 includes a plurality of latches L0 to Ln connected in series with each other and a plurality of dummy latches DL0 to DLn connected in series with each other. FIG. 13 shows only the latch L0 of the initial stage, the latch Ln of the last state, latches Li−1 (i=0 to n−1) of even-number stages, and latches Li of odd-number stages. Each of the latches L0 to Ln is configured by two NAND circuits 301 and 302 circularly connected to each other. One input node of the NAND circuit 301 is connected to the output node of the NAND circuit 302. One input node of the NAND circuit 302 is connected to the output node of the NAND circuit 301.

NAND circuits 303 and 306 are inserted between the latch of a pre-stage and the latch Li+1 of a post-stage. More specifically, one input node of the NAND circuit 303 is connected to the output node of the NAND circuit 301 included in the latch Li of the pre-stage. The control signal DPSE or DPSO is supplied to the other input node of the NAND circuit 303. In this case, the control signal DPSE is supplied to the NAND circuit 303 that supplies an output signal to the latches of the even-number stages. On the other hand, the control signal DPSO is supplied to the NAND circuit 303 that supplies an output signal to the latches of the odd-number stages.

An output signal from the NAND circuit 304 is supplied to the NAND circuit 301 of the latch L0 of the initial stage. The control signal DPSO is supplied to one input node of the NAND circuit 304. The other input node of the NAND circuit 304 is fixed to a high level. Furthermore, an output signal from the NAND circuit 301 of the latch Ln of the last stage is supplied to one input node of a NAND circuit 305. The other input node of the NAND circuit 305 is fixed to a low level. The NAND circuit 305 is a dummy circuit to make the load of the NAND circuit 301 included in the latch Ln of the last stage equal to the load of the NAND circuit 301 included in each of the other latches L0 to Ln−1.

One input node of the NAND circuit 306 is connected to the output node of the NAND circuit 302 included in the latch Li+1 of the post-stage. The control signal DNSE or DNSO is supplied to the other input node of the NAND circuit 306. In this case, the control signal DNSE is supplied to the NAND circuit 306 that supplies an output signal to the latches of the even-number stages. On the other hand, the control signal DNSO is supplied to the NAND circuit 306 that supplies an output signal to the latches of the odd-number stages.

An output signal from a NAND circuit 307 is supplied to the NAND circuit 302 of the latch Ln of the last stage. The control signal DNSE is supplied to one input node of the NAND circuit 307. The other input node of the NAND circuit 307 is fixed to a high level. Furthermore, an output signal from the NAND circuit 302 of the latch L0 of the initial stage is supplied to one input node of a NAND circuit 308. The other input node of the NAND circuit 308 is fixed to a low level. The NAND circuit 308 is a dummy circuit to make the load of the NAND circuit 302 included in the latch L0 of the initial stage equal to the load of the NAND circuit 302 included in each of the other latches L1 to Ln.

The dummy latches DL0 to DLn have the same circuit configurations as those of the latches L0 to Ln. More specifically, each of the dummy latches DL0 to DLn is configured by the two NAND circuits 311 and 312 circularly connected to each other. One input node of the NAND circuit 311 is connected to the output node of the NAND circuit 312. One input node of the NAND circuit 312 is connected to the output node of the NAND circuit 311.

The other input node of a NAND circuit 311, like the NAND circuit 301, is connected to the output node of the NAND circuit 303 or 304. Furthermore, the other input node of the NAND circuit 312, like the NAND circuit 302, is connected to the output node of the NAND circuit 306 or 307.

With the configuration, the contents held in the dummy latches DL0 to DLn are always the same as the contents held in the latches L0 to Ln. As shown in FIG. 13, the dummy latches DL0 to DLn are not connected in series with each other. Output signals SELTj and SELBj (j=0 to n) from the NAND circuits 311 and 312 are supplied to the variable delay circuit 110. The output signals SELTj and SELBj are complementary signals.

The variable delay circuit 110 includes NAND circuits 321 connected in series with each other and NAND circuits 322 connected in series with each other. The NAND circuits 321 and 322 are arranged for each of the latches L0 to Ln (dummy latches DL0 to DLn), respectively. Of the NAND circuits, the NAND circuit 321 configures a forward logical circuit that propagates the clock signal RCLK from the left side to the right side in FIG. 13. On the other hand, the NAND circuit 322 configures a backward logical circuit that propagates the clock signal DCLK from the right side to the left side in FIG. 13.

More specifically, the output node of the NAND circuit 321 corresponding to the latch Li of the pre-stage is connected to one input node of the NAND circuit 321 corresponding to the latch L1+1 of the post-stage. The clock signal RCLK is supplied to one input node of the NAND circuit 321 corresponding to the latch L0 of the initial stage. The corresponding output signal SELTj is supplied to the other input node of the NAND circuit 321.

With the configuration, the NAND circuit 321 having the corresponding output signal SELTj at a high level propagates the clock signal RCLK to the post-stage. In contrast to this, when the corresponding output SELTj is at a low level, the NAND circuit 321 blocks the clock signal RCLK from being propagated.

The variable delay circuit 110 further includes a NAND circuit 323 that transfers the clock signal RCLK input to the NAND circuit 321 to the NAND circuit 322. The NAND circuit 323 configures a loopback logical circuit that transfers the clock signal RCLK propagated through the forward logical circuit to the backward logical circuit.

More specifically, one input node of the NAND circuit 323 is connected to the output node of the NAND circuit 321 of the pre-stage. The corresponding output signal SELBj is supplied to the other input node of the NAND circuit 323. The output node of the NAND circuit 323 is supplied to one input nodes of the NAND circuits 322 and 324.

With the configuration, the NAND circuit 323 having the corresponding output signal SELBj at a high level transfers the clock signal RCLK to the corresponding NAND circuit 322. The NAND circuit 324 is a dummy circuit to make the loads of the NAND circuits 322 and 323 equal to those of the NAND circuits 301 and 303.

The output node of the NAND circuit 322 corresponding to the latch Li+1 of the post-stage is connected to the other input node of the NAND circuit 322 corresponding to the latch Li of the pre-stage. For this reason, the clock signal RCLK turned by the NAND circuit 323 is propagated through the NAND circuits 322 connected in series with each other and output as the clock signal DCLK. When all the SELB0 to SELBn are set at a low level, the RCLK propagated to the final stage is turned through the NAND circuit 325.

The above configuration is the circuit configuration of the variable delay circuit 110 and the register 120. With the configuration, a turning position of the clock signal RCLK propagated through the variable delay circuit 110 is determined depending on contents (control information) held in the latches L0 to Ln. For example, it will be considered that the output signals SELT0 to SELT9 are set at a high level and the output signal SELT10 is set at a low level. In this case, the clock signal RCLK passes through the NAND circuits 321 of 10 stages and is turned by the NAND circuit 323. At the point of time, the clock signals RCLK consequently passes through the NAND circuits of the 11 stages. The turned clock signals RCLK further passes through the NAND circuit 322 of 11 stages and is output as the clock signal DCLK. In this manner, the clock signal RCLK consequently passes through the NAND circuits of a total of 22 stages. More specifically, the clock signal DCLK has a delay corresponding to a delay time of the NAND circuits of the 22 stages with reference to the clock signal RCLK.

In the first place, the clock signal RCLK consequently passes through the NAND circuits of a total of 2 stages. Then the clock signal RCLK consequently passes through the NAND circuits of a total of 22 stages. The NAND circuits of a total of 20 stages are added.

In the above case, the latches L0 to L9 latch high-level signals, and the latch L10 latches a low-level signal. More specifically, the NAND circuits 301 included in the latches L0 to L9 output high-level signals, and the NAND circuits 303 and 304 connected to the inputs and the outputs of the NAND circuit 301 output low-level signals. On the other hand, the NAND circuit 301 included in the latch L10 outputs a low-level signal. The number of stages of the NAND circuits 301 and 303 counted from the NAND circuit 304 to the latch L10 corresponding to the turning position is 22. That is, the number is equal to the number of stages of the NAND circuits through which the clock signal RCLK passes.

In addition, each of all the NAND circuits described above has two inputs, and has a configuration in which two 2-input NAND circuits are connected to the post-stage. This means that the loads of the NAND circuits, in other words, times required to cause signals to pass through the NAND circuits, respectively, are equal to each other. All the dummy latches DL0 to DLn and the dummy NAND circuits 305, 308, and 324 are dummy circuits to satisfy the above conditions.

Figure 14:
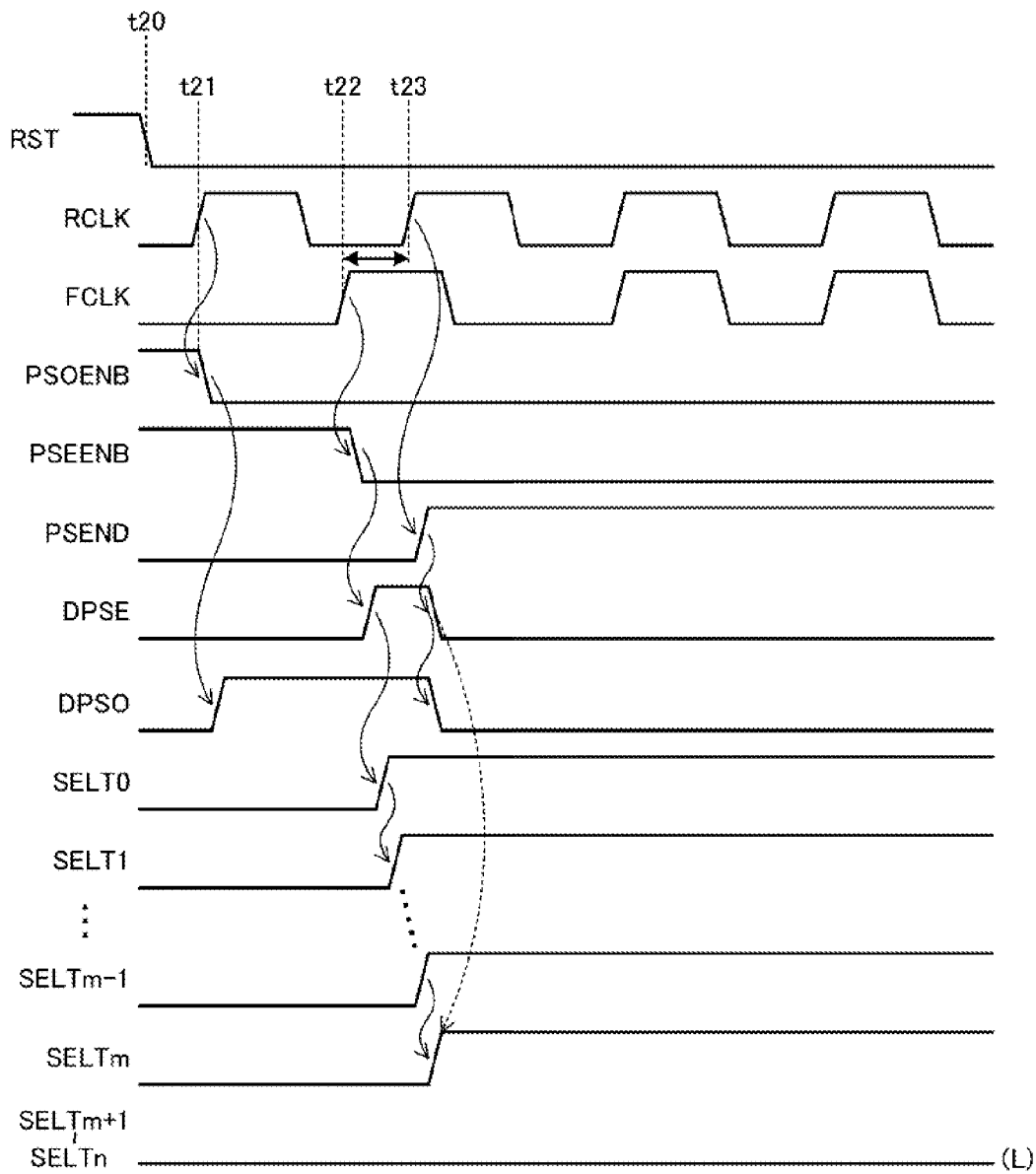
FIG. 14 is a waveform chart showing an example of an initial operation of the DLL circuit 100.

FIG. 14 is a waveform chart showing an example of an initial operation of the DLL circuit 100 according to an embodiment of the invention. In the example shown in FIG. 14, a phase difference between the clock signal DCLK and the clock signal RCLK is ½ a clock cycle.

In the example, as in the example shown in FIG. 6, the reset signal RST changes from a high level to a low level at time t20. For a period in which the reset signal RST is activated to a high level, the control signals PSOENB and PSEENB are fixed to a high level, and the PSEND is fixed to a low level. For a period in which the reset signal RST is activated to a high level, the logical circuit 163 shown in FIG. 10 sets the control signals DNSE and DNSO at a high level. For this reason, the latches L0 to Ln shown in FIG. 13 are sequentially reset from the last-stage (Ln) side. In this manner, after a predetermined period has elapsed, all the latches L0 to Ln are reset.

The reset signal RST changes from a high level to a low level at time t20. Thereafter, the clock signal RCLK rises at time t21, the control signal PSOENB changes to a low level.

When the clock signal DCLK rises at time t22, the control signal PSEENB changes to a low level. When the clock signal RCLK rises again at time t23, the control signal PSEND changes to a high level. The operation is the same as that described with reference to FIG. 6.

For a period in which both the control signals PSOENB and PSEND are at a low level, with the operation of the logical circuit 163 shown in FIG. 10, the control signal DPSO goes to a high level. For a period in which both the control signals PSEENB and PSEND are at a low level, with the operation of the logical circuit 163, the control signal DPSE goes to a high level.

When the control signal DPSO goes to a high level, an output signal from the NAND circuit 304 shown in FIG. 13 is inverted to a low level. In this manner, an output signal from the NAND circuit 301 included in the latch L0 of the initial stage is inverted to a high level. However, for a period in which the control signal DPSE is at a low level, since an output signal from the next NAND circuit 303 is fixed to a high level, inversion of the NAND circuits is stopped at the latch L0 of the initial stage.

When the control signal DPSE changes to a high level, the NAND circuits in the register 120 are sequentially inverted. In this manner, the contents held in the latches L1, L2, L3, . . . are inverted at a high speed in the order named. This operation is stopped when the control signals DPSO and DPSE return to a low level. This means that, for only a period in which both the control signals DPSO and DPSE are at a high level, the latches L1, L2, L3, . . . are sequentially inverted. Thus, a latch the inversion of which is stopped is defined by the pulse width of the control signal DPSE.

The pulse width of the control signal DPSE, as is apparent from FIG. 14, corresponds to a phase difference between the clock signal DCLK and the clock signal RCLK. Thus, when the phase difference is long, sequential inversion continues for a long period of time, and the inversion is stopped at a latch of a later stage. In the example shown in FIG. 14, the inversion continues until the latch Lm, and the inversion is stopped at a latch Lm+1. For this reason, the output signals SELT0 to SELTm go to a high level, and output signals SELTm+1 and later goes to a low level.

When the operation described above is performed, the phase difference between the clock signal DCLK and the clock signal RCLK becomes almost zero. This is because the number of NAND circuits being present in a section from the NAND circuit 304 to the latch Lm+1 is almost equal to the number of NAND circuits being present on a propagation path of the clock signal RCLK in the variable delay circuit 110. In addition, the NAND circuits included in the variable delay circuit 110 and the register 120 have equal loads, respectively. For this reason, when the numbers of NAND circuits through which clock signals pass are equal to each other, propagation times of the signals are equal to each other.

In this manner, adjustment of a delay time by the variable delay circuit 110 is immediately completed by the initial operation and approximately set in a locked state. Although not especially limited, another variable delay circuit having a small adjustment pitch may be arranged in series with the variable delay circuit 110. More specifically, the phase of the clock signal DCLK may be roughly adjusted by the variable delay circuit 110, and the phase of the clock signal DCLK may be finely adjusted by the other variable delay circuit.

Figure 15:
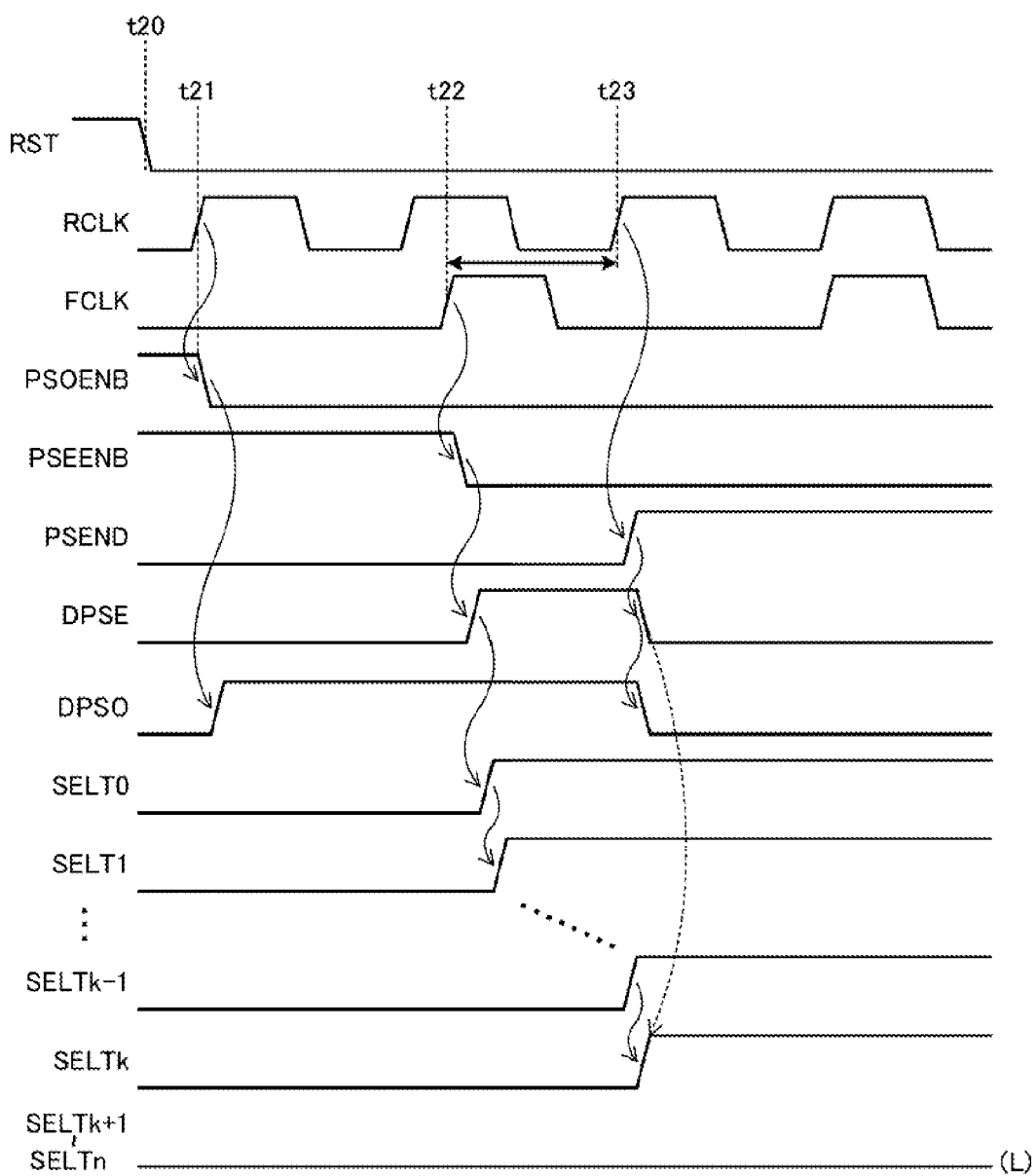
FIG. 15 is a waveform chart showing another example of the initial operation of the DLL circuit of FIG. 2 according to an embodiment of the invention.

FIG. 15 is a waveform chart showing another example of the initial operation of the DLL 100 according to an embodiment of the invention. In the example shown in FIG. 15, the phase difference between the clock signal DCLK and the clock signal RCLK is ½ or more the clock cycle.

The operation shown in FIG. 15 is basically the same as the operation shown in FIG. 14. In the example shown in FIG. 15, since a phase difference between the clock signal DCLK and the clock signal RCLK is large, a period in which both the control signals DPSO and DPSE are at a high level is long. For this reason, sequential inversion of the latches L1, L2, 13, . . . continues for a period longer than that in the example in FIG. 14. In the example shown in FIG. 15, the inversion continues until a latch Lk (k>m), and the inversion is stopped at a latch Lk+1. For this reason, the signals SELT0 to SELTk go to a high level, and the signals SELTk+1 and later go to a low level.

In this manner, the phase difference between the clock signal DCLK and the clock signal RCLK becomes almost zero. As described above, even though the clock signal DCLK and the clock signal RCLK have any phase difference, the adjustment is approximately set in a locked state immediately by the initial operation.

Upon completion of the initial operation, the adjustment of the variable delay circuit 110 is continuously executed to maintain the locked state. This is because the phase difference between the clock signal DCLK and the clock signal RCLK increases with time due to changes in power supply voltage and temperature.

An adjustment operation of the variable delay circuit 110 after the initial operation is performed as follows.

Figure 16:
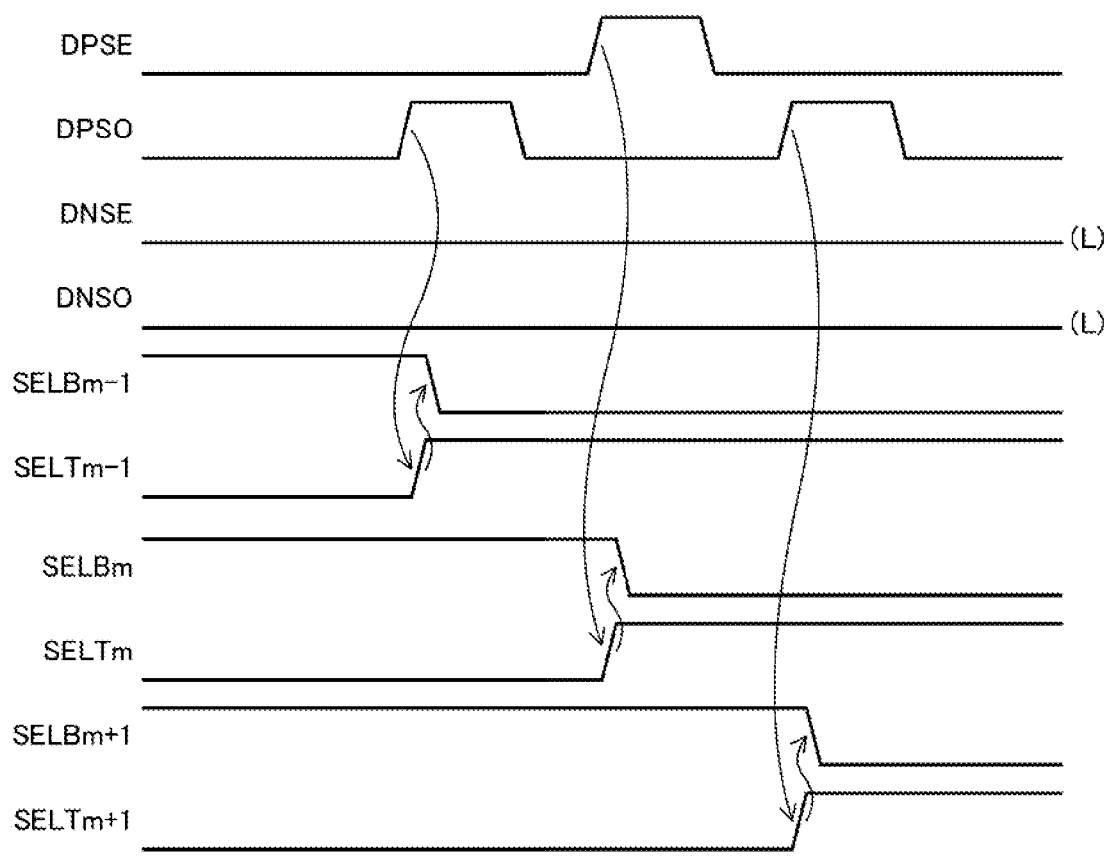
FIG. 16 is a waveform chart showing an example in which a delay amount obtained by the variable delay circuit is added.

When the phase of the clock signal DCLK advances with reference to the clock signal RCLK, control is performed such that a delay mount obtained by the variable delay circuit 110 increases. When the phase of the clock signal DCLK advances with reference to the clock signal RCLK, the clock signal detection circuit 140 sets the control signal PSEN at a high level. In this case, as shown in FIG. 16, the control signals DPSE and DPSO alternately go to a high level in synchronization with the clock signal SCLK. When the control signals DPSE and DPSO alternately go to a high level, a boundary position between a latch holding a high-level signal and a latch having a low-level signal moves to the right in FIG. 13. In the example shown in FIG. 16, the last latch having a high-level signal sequentially moves to the latches Lm−1, Lm, and Lm+1, . . . In response to this, a delay mount obtained by the variable delay circuit 110 is added.

Figure 17:
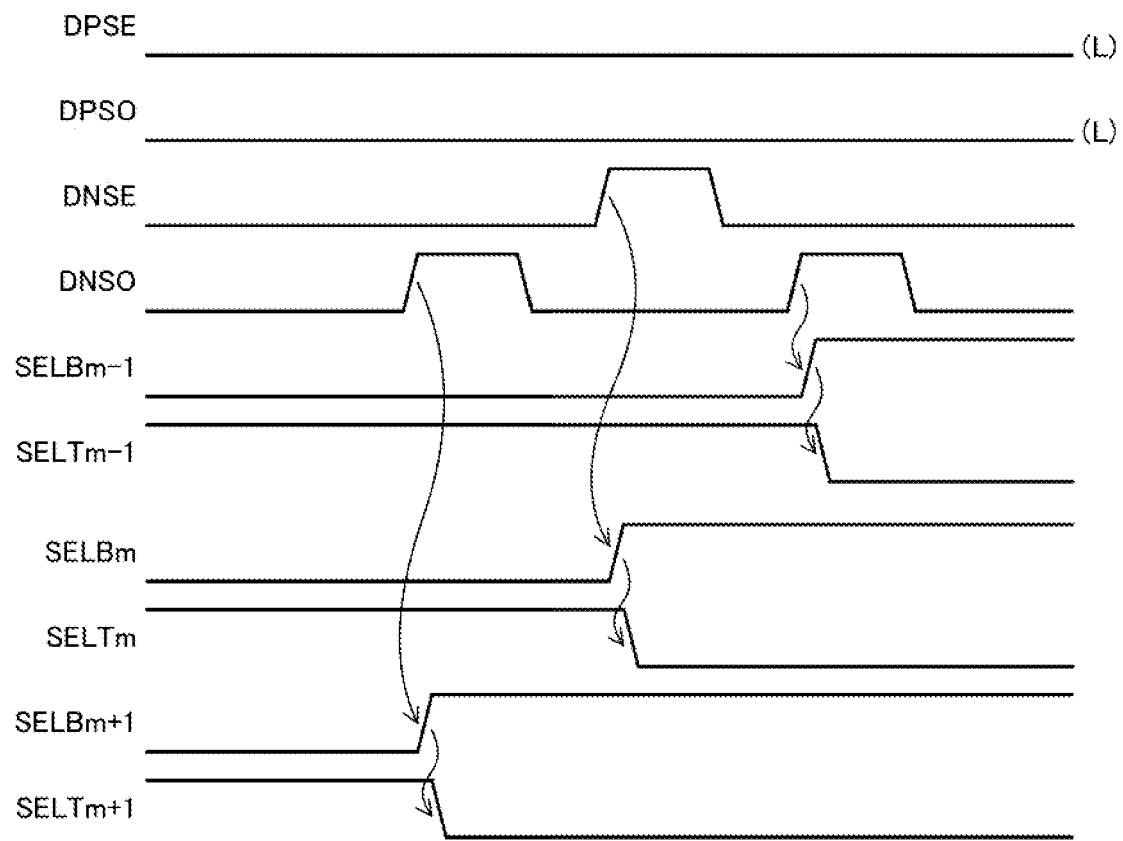
FIG. 17 is a waveform chart showing an example in which a delay amount obtained by the variable delay circuit is subtracted.

When the phase of the clock signal DCLK delays with reference to the clock signal RCLK, control is performed such that a delay mount obtained by the variable delay circuit 110 decreases. When the phase of the clock signal DCLK delays with reference to the clock signal RCLK, the clock signal detection circuit 140 sets the control signal NSEN at a high level. In this case, as shown in FIG. 17, the control signals DNSE and DNSO alternately go to a high level in synchronization with the clock signal SCLK. When the control signals DNSE and DNSO alternately go to a high level, a boundary position between a latch holding a high-level signal and a latch having a low-level signal moves to the left in FIG. 13. In the example shown in FIG. 17, the last latch having a high-level signal sequentially moves to the latches Lm+1, Lm, and Lm−1, . . . In response to this, a delay mount obtained by the variable delay circuit 110 is subtracted.

The above operation is repeatedly executed to keep the state in which the phases of the clock signal DCLK and the clock signal RCLK are the same as each other. More specifically, the locked state is maintained.

As described above, the DLL circuit 100 according to the embodiment is immediately set in a locked state by an initial operation using the phase difference detection circuit 150.

Since the DLL circuit 100 is configured by a simple logical circuit together with the phase difference detection circuit 150 and the control circuit 160, a circuit scale is suppressed from increasing.

Figure 18:
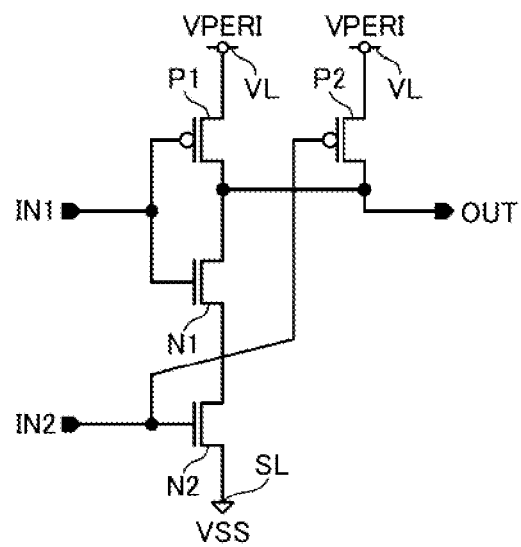
FIG. 18 is a circuit diagram of an ordinary 2-input NAND circuit.

FIG. 18 is a circuit diagram of an ordinary 2-input NAND circuit according to an embodiment of the invention.

The NAND circuit shown in FIG. 18 includes P-channel MOS transistors P1 and P2 and N-channel MOS transistors N1 and N2. The transistors P1 and P2 are connected in parallel between a power supply wiring VL to which the power supply potential VPERI is supplied and an output node OUT. On the other hand, the transistors N1 and N2 are connected in series between a power supply wiring SL to which the ground potential VSS is supplied and the output node OUT. The gate electrodes of the transistors P1 and N1 are connected to a first input node IN1. The gate electrodes of the transistors P2 and N2 are connected to the second input node IN2.

In the NAND circuit shown in FIG. 18, when the input node IN2 changes from a low level to a high level in the state in which the input node IN1 is at a high level, the output node OUT changes to a low level. Similarly, when the input node IN1 changes from a low level to a high level in a state in which the input node IN2 is at a high level, the output node OUT changes to a low level. However, at a timing at which the output node OUT changes to a low level changes depending on the former condition and the later condition. This is because the transistor N1 is connected to the output node OUT, and the transistor N2 is connected to the power supply wiring SL.

Figure 19:
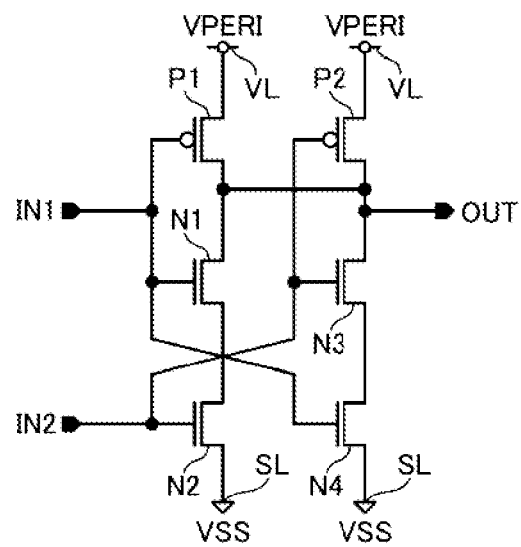
FIG. 19 is a circuit diagram of an improved 2-input NAND circuit according to an embodiment of the invention.

FIG. 19 is a circuit diagram of an improved 2-input NAND circuit according to an embodiment of the invention.

The NAND circuit shown in FIG. 19 is different from the NAND circuit shown in FIG. 18 in that N-channel MOS transistors N3 and N4 are added. With respect to the other points, the NAND circuit is the same as the NAND circuit shown in FIG. 18. For this reason, the same reference numerals as in FIG. 18 denote the same elements in FIG. 19, and overlapping explanations will not be made.

The transistors N3 and N4 are connected in series between the power supply wiring SL to which the ground potential VSS is supplied and the output node OUT. The gate electrode of the transistor N3 is connected to the second input node IN2. The gate electrode of the transistor N4 is connected to the first input node IN1. The transistors N1 and N3 are connected to the output node OUT, and the transistors N2 and N4 are connected to the output node OUT.

With the configuration, the input node IN1 and the input node IN2 have the same conditions on the circuits. For this reason, a timing at which the output node OUT changes to a low level does when the input node IN1 changes to a high level is not different from that when the input node IN2 changes to a high level.

Thus, when the NAND circuits shown in FIG. 19 are used as the NAND circuits connected in series shown in FIG. 13, even though any one of the input nodes is connected to the NAND circuit of the pre-stage, delay times are not different from each other. The NAND circuits connected in series with each other are, for example, the NAND circuits 301 to 303, 306, 321, and 322. Since the NAND circuit shown in FIG. 19 is used to decrease the restriction of wiring connection in design, the NAND circuit can be easily designed.

An embodiment of the present invention has been described above. However, the present invention is not limited to the above embodiments, and various changes can be effected without departing from the spirit and scope of the present invention. The various changes are included in the scope of the present invention as a matter of course.

For example, circuit configurations of various logical circuits described in the embodiment are only examples, and the present invention is not limited to the circuit configurations.

In the embodiment, all the latches L0 to Ln are reset in resetting to set the delay amount of the variable delay circuit 110 to a minimum value. Thereafter, when the reset signal RST is inactivated, depending on a phase difference between the clock signals RCLK and DCLK, the latches L0 to Ln are inverted in the order named to increase the delay amount. However, in the present invention, an operation opposite to the above operation may be performed. In this case, all the latches L0 to Ln may be set in resetting to set the delay amount of the variable delay circuit 110 to a maximum value. Thereafter, when the reset signal RST is inactivated, depending on a phase difference between the clock signals RCLK and DCLK, the latches L0 to Ln may be inverted in the reverse order of the order named to reduce the delay amount.

What is claimed is:

1. A semiconductor device comprising:
   a phase difference detection circuit configured, responsive to first and second clock signals each clocking between first and second logic levels, to generate a first control signal that takes an active level, the active level being defined by a first change of the first clock signal from the first logic level to the second logic level and by a second change of the second clock signal from the first logic level to the second logic level, the first and second changes occurring adjacently to each other;
   a register circuit including a plurality of first logic elements coupled in series and receiving the first control signal and a second control signal, the register circuit being configured to pass the second control signal through first logic elements of the plurality of first logic elements during the active level of the first control signal to generate control information that indicates a first number of the plurality of first logic elements through which the second control signal has passed during the active level of the first control signal; and
   a delay circuit receiving the first clock signal and the control information, the delay circuit being configured to produce a third clock signal by delaying the first clock signal by an amount responsive to the control information.

2. The semiconductor device as claimed in claim 1, further comprising:
   a feedback circuit configured to produce the second clock signal responsive to the third clock signal.

3. The semiconductor device as claimed in claim 1, wherein the delay circuit comprises a plurality of second logic elements coupled in series, a second number of the plurality of second logic elements being designated by the control information.

4. The semiconductor device as claimed in claim 3, wherein the second number is greater than the first number.

5. The semiconductor device as claimed in claim 4, wherein the second number is greater than the first number by two.

6. The semiconductor device as claimed in claim 1, wherein the phase difference detection circuit is configured to operate when a reset signal is activated, and wherein the delay circuit delays the first clock signal to produce the third clock after the reset signal is activated.

7. A semiconductor device comprising:
   a delay circuit receiving a first clock signal and being configured to produce a second clock signal by delaying the first clock signal by an amount based on control information;

a feedback circuit configured to produce a third clock signal responsive to the second clock signal;

a phase difference detection circuit configured, responsive to the first and third clock signals, to generate a control pulse of which a pulse width corresponds to a duration defined by a first change in logic level of the third clock signal and by a second change in logic level of the first clock signal, the first and second changes occurring adjacently to each other in same directions as each other; and a plurality of first logic elements through which a control signal is allowed to pass one after another during the pulse width of the control pulse, and the control information that is supplied to the delay circuit is generated responsive to a first number of the plurality of first logic elements through which the control signal has passed during the pulse width of the control pulse.

8. The semiconductor device as claimed in claim 7, wherein the delay circuit comprises a plurality of second logic elements coupled in series, the first clock signal passing through the plurality of second logic elements.

9. The semiconductor device as claimed in claim 8, wherein each of the plurality of first logic elements is substantially equal in circuit configuration to each of the plurality of second logic elements.

10. The semiconductor device as claimed in claim 9, wherein each of the plurality of first logic elements and each of the plurality of second logic elements comprises a 2-input NAND circuit.

11. The semiconductor device as claimed in claim 7, further comprising a clock signal detection circuit configured to compare phases of the first and third clock signals to produce additional control information, the additional control information being supplied to the delay circuit so that the delay circuit delays the first clock signal by a sum of the amount based on the control information and an additional amount based on the addition control information.

12. The semiconductor device as claimed in claim 11, wherein the phase difference detection circuit is activated while the clock signal detection circuit is being deactivated, and the clock signal detection circuit is activated while the phase difference detection circuit is being deactivated.

13. A semiconductor device comprising:

a first circuit comprising a plurality of first logic elements coupled in cascade and configured, responsive to first and second clock signals and a control signal, to produce control information that indicates a first number of the first logic elements through which the control signal has been propagated during a period defined by a first change in logic level of the first clock signal and by a second change in logic level of the second clock signal, the first and second changes occurring adjacently to each other in same directions as each other; and a second circuit comprising a delay circuit configured to receive the first clock signal and the control information and to produce a third clock signal by delaying the first clock signal by an amount responsive to the control information.

14. The semiconductor device as claimed in claim 13, further comprising:

a third circuit configured to produce the second clock signal responsive to the third clock signal.

15. The semiconductor device as claimed in claim 14, further comprising a fourth circuit comparing phases of the first and second clock signals to produce additional control information, the additional control information being supplied to the first circuit, and the first circuit is configured to delay the first clock signal by a sum of the amount based on the control information and an additional amount based on the addition control information.

16. The semiconductor device as claimed in claim 15, wherein the first circuit is activated while the fourth circuit is being deactivated, and the fourth circuit is activated while the first circuit is being deactivated.

17. The semiconductor device as claimed in claim 16, wherein the delay circuit comprises a plurality of second logic elements configured to delay the first clock signal, each of the plurality of first logic elements being substantially equal in circuit configuration to each of the plurality of second logic elements.

18. The semiconductor device as claimed in claim 17, wherein a second number of the second logic elements is designated responsive to the control information to represent the amount based on the control information.

* * * * *